(12) United States Patent
Ando et al.

(10) Patent No.: US 12,136,533 B2
(45) Date of Patent: Nov. 5, 2024

(54) ANTENNA MECHANISM AND PLASMA PROCESSING DEVICE

(71) Applicant: NISSIN ELECTRIC CO., LTD., Kyoto (JP)

(72) Inventors: Yasunori Ando, Kyoto (JP); Daisuke Matsuo, Kyoto (JP)

(73) Assignee: NISSIN ELECTRIC CO., LTD., Kyoto (JP)

( * ) Notice: Subject to any disclaimer, the term of this patent is extended or adjusted under 35 U.S.C. 154(b) by 112 days.

(21) Appl. No.: 17/797,434

(22) PCT Filed: Mar. 10, 2020

(86) PCT No.: PCT/JP2020/010350
§ 371 (c)(1),
(2) Date: Aug. 4, 2022

(87) PCT Pub. No.: WO2021/181531
PCT Pub. Date: Sep. 16, 2021

(65) Prior Publication Data
US 2023/0063182 A1    Mar. 2, 2023

(51) Int. Cl.
*H01J 37/32* (2006.01)
(52) U.S. Cl.
CPC ................................ *H01J 37/3211* (2013.01)
(58) Field of Classification Search
CPC ........... H01J 37/3211; H01P 5/02; H05H 1/46
See application file for complete search history.

(56) References Cited

U.S. PATENT DOCUMENTS

| 6,887,339 | B1 | 5/2005 | Goodman et al. |
| 2010/0194281 | A1 | 8/2010 | Carter et al. |
| 2020/0105503 | A1* | 4/2020 | Notomi ................. H01J 37/3211 |
| 2021/0057184 | A1* | 2/2021 | Sugimoto ............ H01J 37/3244 |

FOREIGN PATENT DOCUMENTS

| CN | 101834336 | | 9/2010 | |
| CN | 103517536 A | * | 1/2014 | ............ H01J 37/321 |
| JP | 2008042866 | | 2/2008 | |
| JP | 2013206652 | | 10/2013 | |
| JP | 2013206652 A | * | 10/2013 | |

(Continued)

OTHER PUBLICATIONS

"International Search Report (Form PCT/ISA/210) of PCT/JP2020/010350", mailed on Jun. 9, 2020, with English translation thereof, pp. 1-4.

(Continued)

*Primary Examiner* — Abdullah A Riyami
*Assistant Examiner* — Syed M Kaiser
(74) *Attorney, Agent, or Firm* — JCIPRNET

(57) ABSTRACT

According to the present invention, provided is an antenna mechanism 3 that adjusts the impedance of an antenna body through which a high-frequency current flows to generate plasma by means of a simple configuration, and generates plasma P, and comprises: the antenna body 31 through which high-frequency current flows; and one or a plurality of adjustment circuits 32 provided adjacent to the antenna body 31. The adjustment circuit 32 has a metal conductor 321 forming a closed circuit and a capacitor 322 forming the closed circuit.

13 Claims, 5 Drawing Sheets

(56) References Cited

FOREIGN PATENT DOCUMENTS

| JP | 6341329 | 6/2018 |
| JP | 2018133326 | 8/2018 |
| KR | 20130140571 | 12/2013 |
| WO | 2009126386 | 10/2009 |
| WO | WO-2019181095 A1 * | 9/2019 |

OTHER PUBLICATIONS

Office Action of China Counterpart Application, with English translation thereof, issued on Apr. 26, 2023, pp. 1-16.
Office Action of China Counterpart Application, with English translation thereof, issued on Nov. 21, 2023, pp. 1-16.
Office Action of Korean Counterpart Application, with English translation thereof, issued on Nov. 30, 2023, pp. 1-10.

* cited by examiner

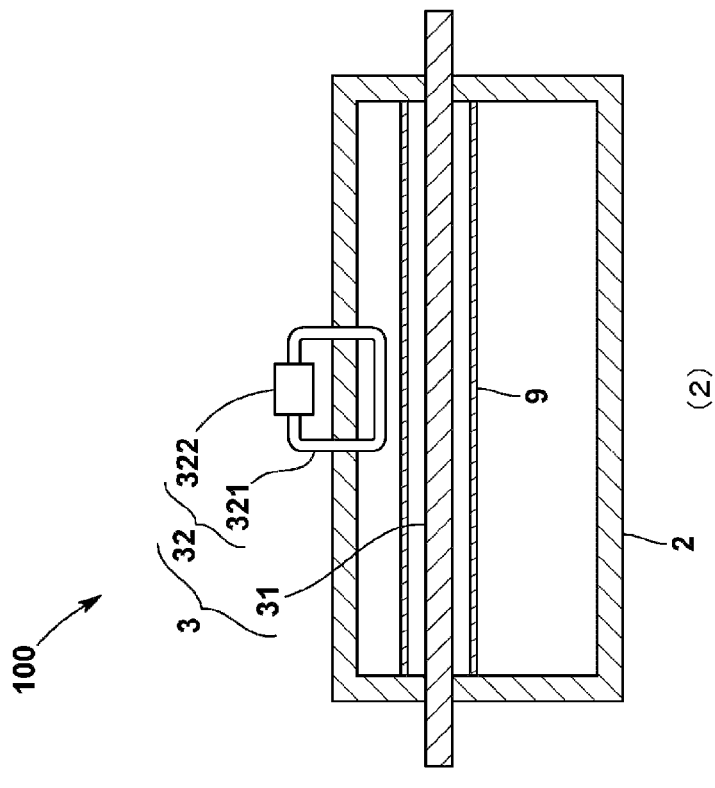
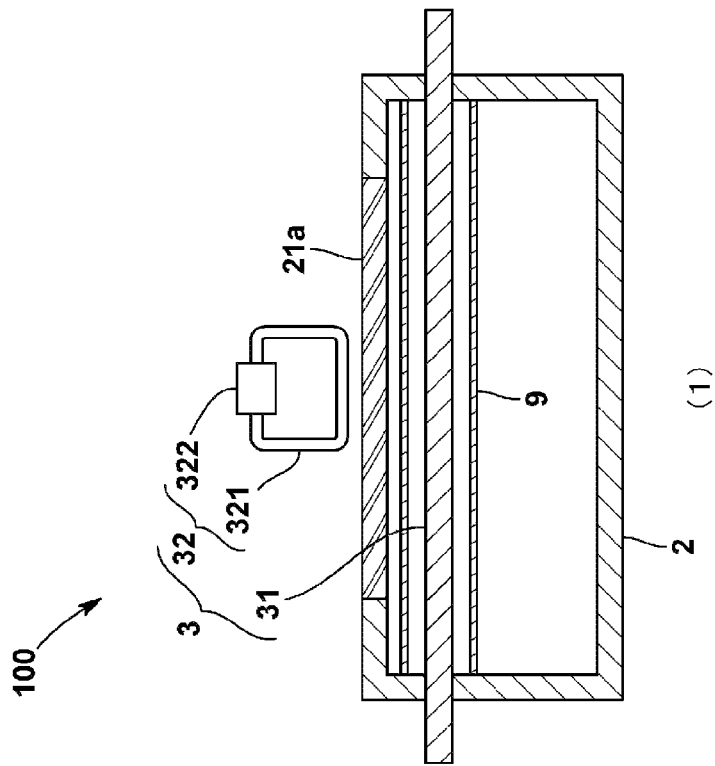
FIG. 5

ANTENNA MECHANISM AND PLASMA PROCESSING DEVICE

CROSS-REFERENCE TO RELATED APPLICATION

This application is a 371 application of the International PCT application serial no. PCT/JP2020/010350, filed on Mar. 10, 2020. The entirety of the above-mentioned patent application is hereby incorporated by reference herein and made a part of this specification.

TECHNICAL FIELD

The present invention relates to an antenna mechanism and a plasma processing device.

RELATED ART

Conventionally, a plasma processing device has been proposed, which applies a high-frequency current to an antenna, generates inductively coupled plasma (abbreviated as ICP) by an induced electric field generated therefrom, and processes a substrate W using the inductively coupled plasma.

In this type of plasma processing device, if the length of the antenna is increased to accommodate a large substrate, the impedance of the antenna increases, which causes a large potential difference between both ends of the antenna. As a result, there is a problem that the uniformity of plasma such as the density distribution, the potential distribution, the electron temperature distribution, etc. of the plasma deteriorates under the influence of this large potential difference, and eventually the uniformity of the substrate processing deteriorates. Further, if the impedance of the antenna increases, there is a problem that it becomes difficult for a high-frequency current to flow through the antenna.

In order to solve such problems, as shown in Patent Literature 1, it is conceivable to connect a plurality of metal pipes by interposing a hollow insulator between adjacent metal pipes, and arranging a capacitor, which is a capacitive element, inside the hollow insulator. This capacitor is electrically connected in series to the metal pipes on both sides of the hollow insulator, and has a first electrode electrically connected to the metal pipe on one side of the hollow insulator and a second electrode electrically connected to the metal pipe on the other side of the hollow insulator and arranged coaxially with the first electrode with a space, and is configured by filling the space between the first electrode and the second electrode with a liquid such as a coolant.

CITATION LIST

Patent Literature

[Patent Literature 1] Japanese Patent No. 6341329

SUMMARY OF INVENTION

Technical Problem

However, for the antenna having the above configuration, it is necessary to connect the metal pipes by interposing the hollow insulator between adjacent metal pipes and it is necessary to provide the capacitor inside the hollow insulator. Therefore, the structure of the antenna becomes complicated. In addition, because the capacitor is configured using cooling water that flows inside, a structure for sealing each metal pipe and the hollow insulator with a sealing member is required, which also complicates the structure of the antenna.

Therefore, the present invention has been made to solve the above-mentioned problems, and mainly aims to achieve adjustment of the impedance of the antenna through which a high-frequency current flows to generate plasma by a simple configuration.

Solution to Problem

That is, the antenna mechanism according to the present invention is an antenna mechanism for generating plasma, which includes an antenna body through which a high-frequency current flows; and one or a plurality of adjustment circuits through which a secondary current flows due to the high-frequency current flowing through the antenna body. The adjustment circuit has a metal conductor constituting a closed circuit, and a capacitive element constituting the closed circuit.

According to the antenna mechanism configured in this way, electrostatic capacitance (capacitance) can be effectively developed in the antenna body by mutual induction (mutual inductance) generated between the antenna body and the adjustment circuit. As a result, the impedance of the antenna body can be adjusted by a simple configuration without providing a capacitor in the antenna body. Further, the impedance of the antenna body can be adjusted simply by adjusting the distance between the antenna body and the adjustment circuit, and the impedance can be easily adjusted. Further, since the antenna body is not provided with a capacitor, the antenna body can be made of only a tube such as a metal pipe, and the antenna body can be made thinner and smaller with no limitation on the outer diameter. Moreover, by making the antenna body with only a tube such as a metal pipe, there is no connection portion in the middle of the antenna body, so there is no concern about leakage of cooling water when cooling water flows through the antenna body.

In order to prevent stains and deterioration due to exposure of the antenna body and the adjustment circuit to plasma, and to further facilitate adjustment of the impedance, it is desirable that the antenna body and the adjustment circuit are provided outside the vacuum container that is evacuated.

Since a current flows through the metal conductor that constitutes the closed circuit, Joule heat is generated. In order to cool the metal conductor, it is desirable that the metal conductor has an internal flow path through which cooling water flows inside.

In order to improve the uniformity of the generated plasma, it is desirable that the plurality of adjustment circuits are provided at equal intervals with each other in a length direction of the antenna body.

Similarly, in order to improve the uniformity of the generated plasma, it is desirable that the plurality of adjustment circuits have the same configuration as one another.

Specifically, it is desirable that the metal conductor has a parallel running part that faces the antenna body and extends in parallel with the antenna body, and the parallel running parts of the plurality of adjustment circuits have the same length as one another.

Further, the plasma processing device according to the present invention includes a vacuum container which is evacuated and into which a gas is introduced; the above-mentioned antenna mechanism; and a high-frequency power supply which applies a high-frequency current to the antenna body. The plasma processing device is configured to process an object to be processed using plasma generated by the antenna mechanism. With such a plasma processing device, the impedance of the antenna body can be adjusted by the antenna mechanism, so the plasma density can be made uniform and the processing for the object to be processed can be performed uniformly.

In order to easily adjust the impedance by the antenna mechanism in the plasma processing device, it is desirable that the antenna mechanism is provided outside the vacuum container, and the vacuum container is provided with a dielectric window at a position facing the antenna body. Further, since the antenna mechanism is provided outside (on the atmospheric side) of the vacuum container, the antenna mechanism is less likely to get dirty and deteriorate and can be used for a long period of time, and the frequency of maintenance can be reduced.

Effects of Invention

According to the present invention configured in this way, the impedance of the antenna body through which a high-frequency current flows to generate plasma can be adjusted by a simple configuration.

BRIEF DESCRIPTION OF DRAWINGS

FIG. 5 is a view showing details of the antenna mechanism according to a modified embodiment.

DESCRIPTION OF EMBODIMENTS

Hereinafter, an embodiment of the plasma processing device according to the present invention will be described with reference to the drawings.

<Device Configuration>

A plasma processing device 100 of the present embodiment is for processing an object W to be processed using inductively coupled plasma P. Here, the object W to be processed is, for example, a substrate for a flat panel display (FPD) such as a liquid crystal display and an organic EL display, a flexible substrate for a flexible display, etc. Further, the processing applied on the object W to be processed is, for example, film formation by a plasma CVD method, etching, ashing, sputtering, etc.

The plasma processing device 100 is also called a plasma CVD device when performing film formation by a plasma CVD method, a plasma etching device when performing etching, a plasma ashing device when performing ashing, and a plasma sputtering device when performing sputtering.

Figure 1:
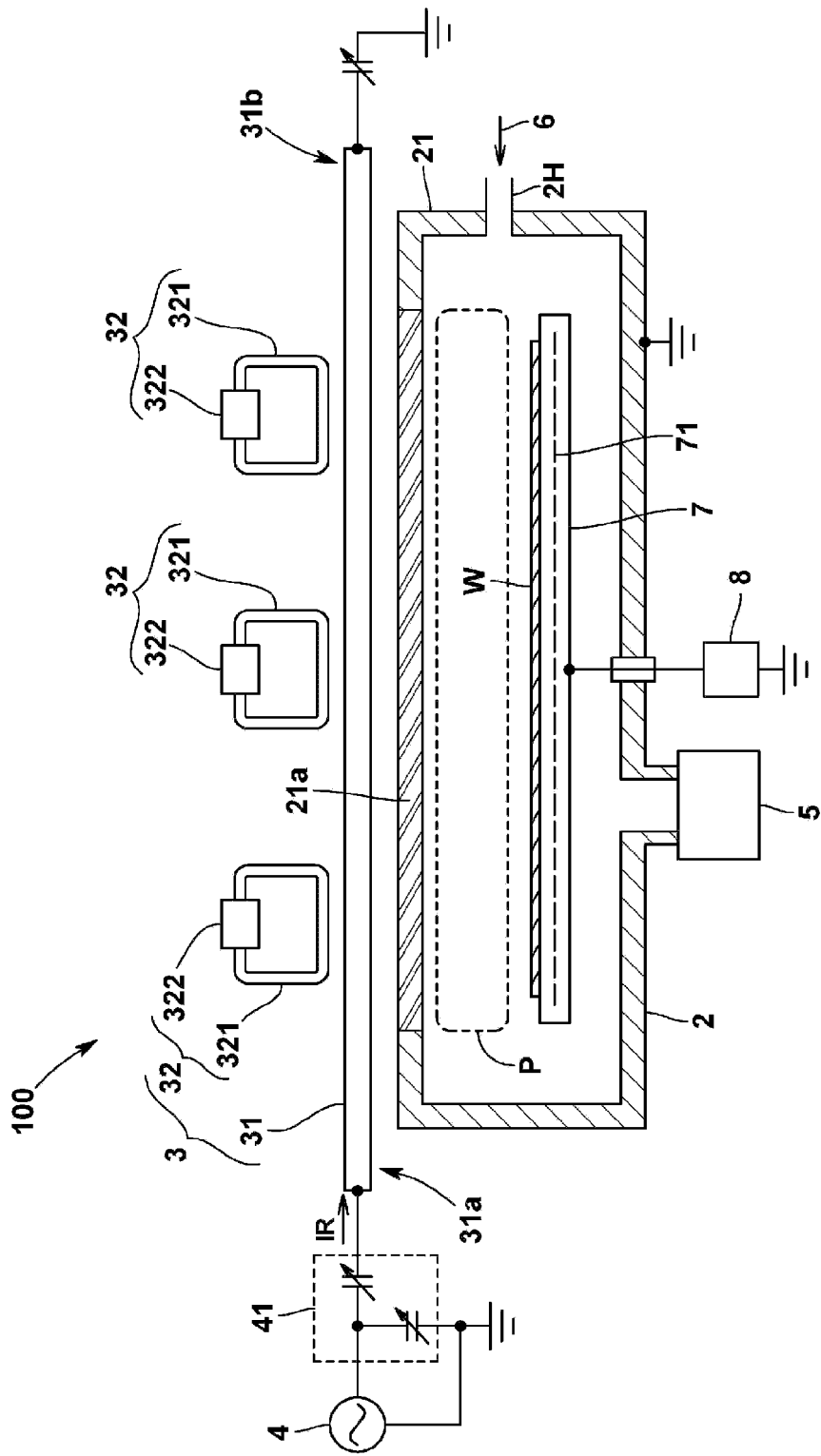
FIG. 1 is a cross-sectional view schematically showing the configuration of the plasma processing device according to an embodiment of the present invention.

Specifically, as shown in FIG. 1, the plasma processing device 100 includes a vacuum container 2 which is evacuated and into which a gas 6 is introduced, an antenna mechanism 3 which has an antenna body 31 for generating plasma P in the vacuum container 2, and a high-frequency power supply 4 which applies a high frequency for generating the plasma P in the vacuum container 2 to the antenna body 31. By applying a high frequency from the high-frequency power supply 4 to the antenna body 31, a high-frequency current IR flows through the antenna body 31 and an induced electric field is generated in the vacuum container 2 to generate the inductively coupled plasma P.

The vacuum container 2 is, for example, a container made of metal, and the inside thereof is evacuated by a vacuum exhaust device 5. The vacuum container 2 is electrically grounded in this example.

The gas 6 is introduced into the vacuum container 2 via, for example, a flow rate regulator (not shown) and a plurality of gas introduction ports 2H arranged in a direction along the antenna body 31. The gas 6 may be selected according to the processing content to be applied on the substrate W. For example, when a film is formed on the substrate W by a plasma CVD method, the gas 6 is a raw material gas or a gas obtained by diluting the raw material gas with a diluting gas (for example, $H_2$).

Further, a substrate holder 7 for holding the substrate W is provided in the vacuum container 2. As in this example, a bias voltage may be applied to the substrate holder 7 from a bias power supply 8. The bias voltage is, for example, a negative DC voltage, a negative bias voltage, etc., but not limited thereto. With such a bias voltage, for example, it is possible to control the energy when the positive ions in the plasma P are incident on the substrate W, to control the crystallinity of the film formed on the surface of the substrate W. A heater 71 for heating the substrate W may be provided in the substrate holder 7.

As shown in FIG. 1, the antenna mechanism 3 includes the antenna body 31 which is provided outside the vacuum container 2 and through which a high-frequency current flows, and a plurality of adjustment circuits 32 which are provided adjacent to the antenna body 31.

The antenna body 31 is a linear metal pipe, and is arranged to face a dielectric window 21a provided on a side wall 21 of the vacuum container 2. The material of the antenna body 31 is, for example, copper, aluminum, an alloy thereof, stainless steel, or the like, but not limited thereto. Further, in the present embodiment, the antenna body 31 may be cooled by flowing a refrigerant such as cooling water inside the antenna body 31. In addition, the outer peripheral surface of the antenna body 31 may be covered with a low resistance material, and in this case, it is desirable that the thickness of the low resistance material is equal to or greater than the penetration depth of the current determined by the frequency of the high-frequency power supplied.

The high-frequency power supply 4 is connected to a power feeding end 31a, which is one end of the antenna body 31, via a matcher 41, and a terminal end 31b, which is the other end, is grounded. With such a configuration, a high-frequency current is applied from the high-frequency power supply 4 to the antenna body 31 via the matcher 41 to generate the inductively coupled plasma P in the vacuum container 2. The frequency of the high frequency is, for example, 13.56 MHz, which is common, but not limited thereto.

The dielectric window 21a provided to face the antenna body 31 is provided so as to close the opening formed in the side wall 21 of the vacuum container 2, and specifically is, for example, a quartz plate or the like. As shown in FIG. 1, the dielectric window 21a is provided along the antenna body 31.

Figure 2:
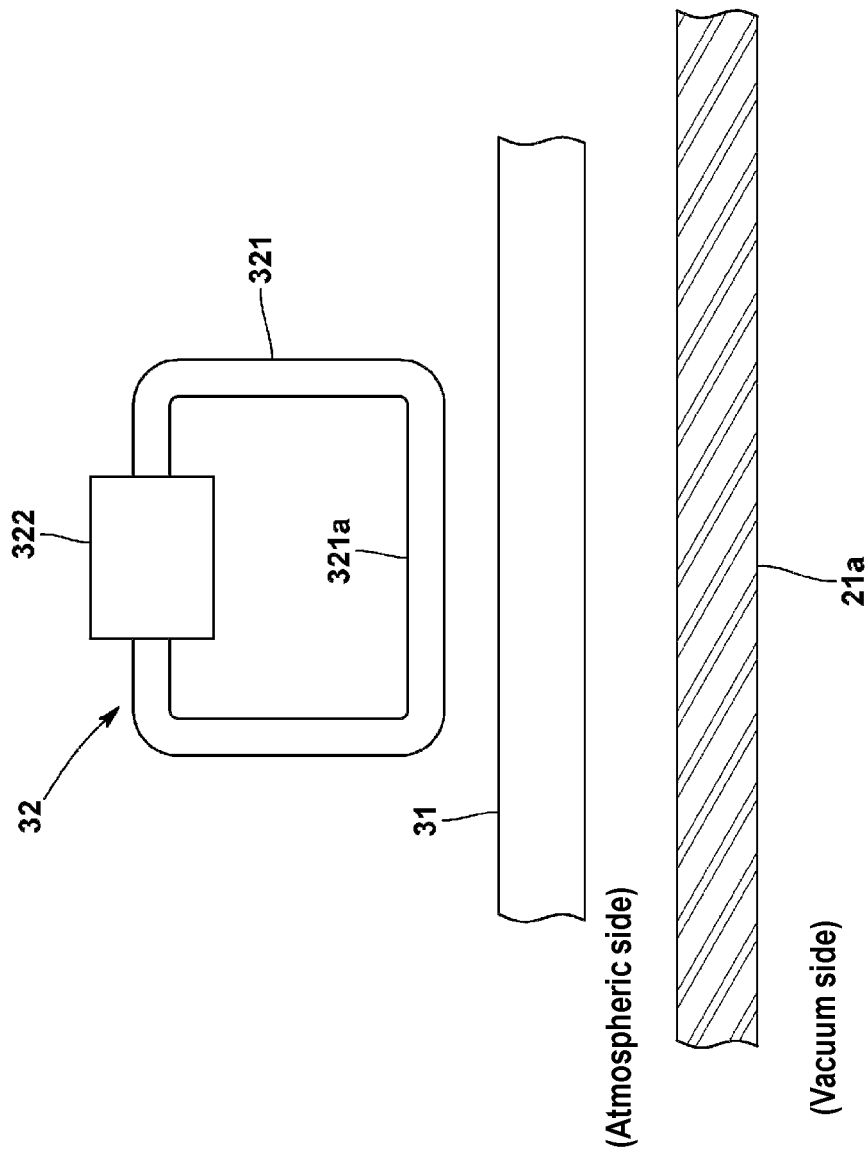
FIG. 2 is a view showing details of the antenna mechanism according to the same embodiment.

As shown in FIG. 2, each of the plurality of adjustment circuits 32 constitutes a closed circuit, and a secondary current (induced current) flows therethrough due to a high-frequency current flowing through the antenna body 31. The adjustment circuits 32 are provided adjacent to each other along the antenna body 31. Each adjustment circuit 32 has a metal conductor 321 having a part thereof provided along the antenna body 31, and a capacitive element 322 such as a capacitor. The closed circuit is configured by the metal conductor 321 and the capacitive element 322. The plurality of adjustment circuits 32 have the same configuration as one another, and are provided at equal intervals with each other in the length direction of the antenna body 31.

The metal conductor 321 has a parallel running part 321a that faces the antenna body 31 and extends in parallel with the antenna body 31. The parallel running parts 321a of the plurality of adjustment circuits 32 are configured to have the same length as one another. The region where one adjustment circuit 32 and the antenna body 31 face each other (the region where one adjustment circuit 32 and the antenna body 31 run in parallel) is a region sufficiently smaller than the length of the antenna body 31.

Further, the metal conductor 321 is made of a metal pipe. The material of the metal conductor 321 is, for example, copper, aluminum, an alloy thereof, stainless steel, or the like, like the antenna body 31, but not limited thereto. Besides, in the present embodiment, the metal conductor 321 may be cooled by flowing a refrigerant such as cooling water inside the metal conductor 321. That is, the metal conductor 321 may have an internal flow path through which cooling water flows inside.

The capacitive element 322 of the adjustment circuit 32 may be a fixed capacitor having a fixed electrostatic capacitance or a variable capacitor having a variable electrostatic capacitance.

Figure 3:
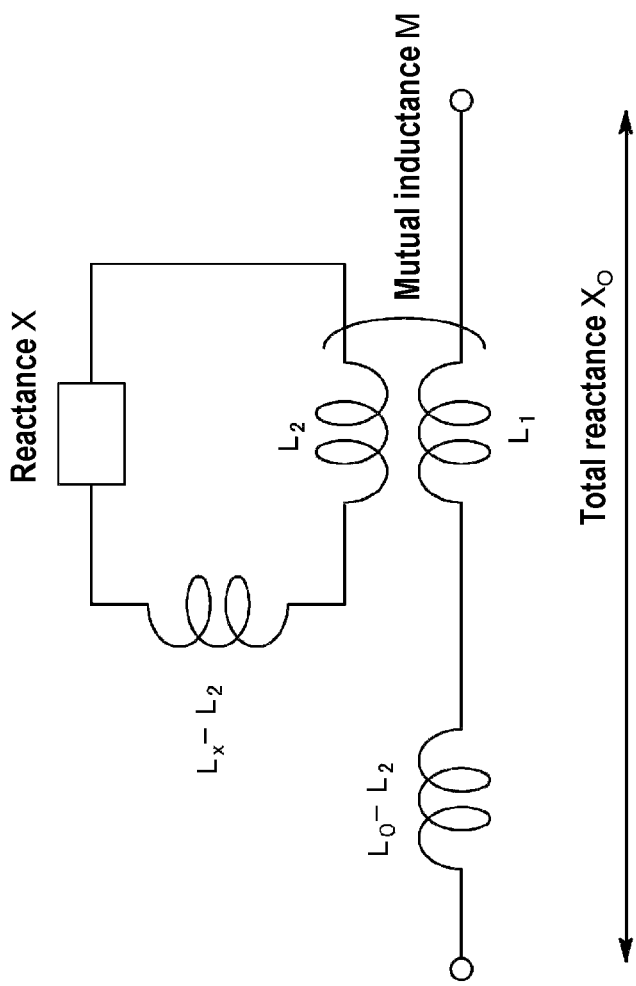
FIG. 3 is a view showing the equivalent circuit of the antenna mechanism according to the same embodiment.

Next, an equivalent circuit in the antenna mechanism 3 having the above configuration is shown in FIG. 3. FIG. 3 shows one adjustment circuit 32, but the present invention is not limited thereto.

Here, $L_0$ is the inductance of the antenna body 31, $L_1$ is a part of $L_0$ and is the inductance of the region that is coupled to the adjustment circuit 32, $L_x$ is the inductance of the adjustment circuit 32, and $L_2$ is a part of $L_x$ and is the inductance of the region that is coupled to the antenna body 31. X is the reactance of the adjustment circuit 32.

The total reactance $X_0$ in this case can be expressed by the following equation.

$$X_0 = \omega\left[L_0 - \frac{\omega M^2}{\omega L_X + X}\right], \omega = 2\pi f (f: \text{frequency})$$ [Equation 1]

In order to reduce $X_0$, the following three cases (1), (2-1), and (2-2) are preferable as the adjustment circuit 32.
(1) The reactance of the adjustment circuit 32 made of a metal pipe or the like is set to zero (X→0).
(2) When $\omega L_x + X > 0$,
  (2-1) An inductor (coil, etc.) is used for X.
  (2-2) A capacitor for setting $\omega L_x > 1/\omega C$ is used.
When $\omega L_x + X < 0$ is set using a capacitor, the reactance $X_0$ is increased, which is not preferable.

Figure 4:
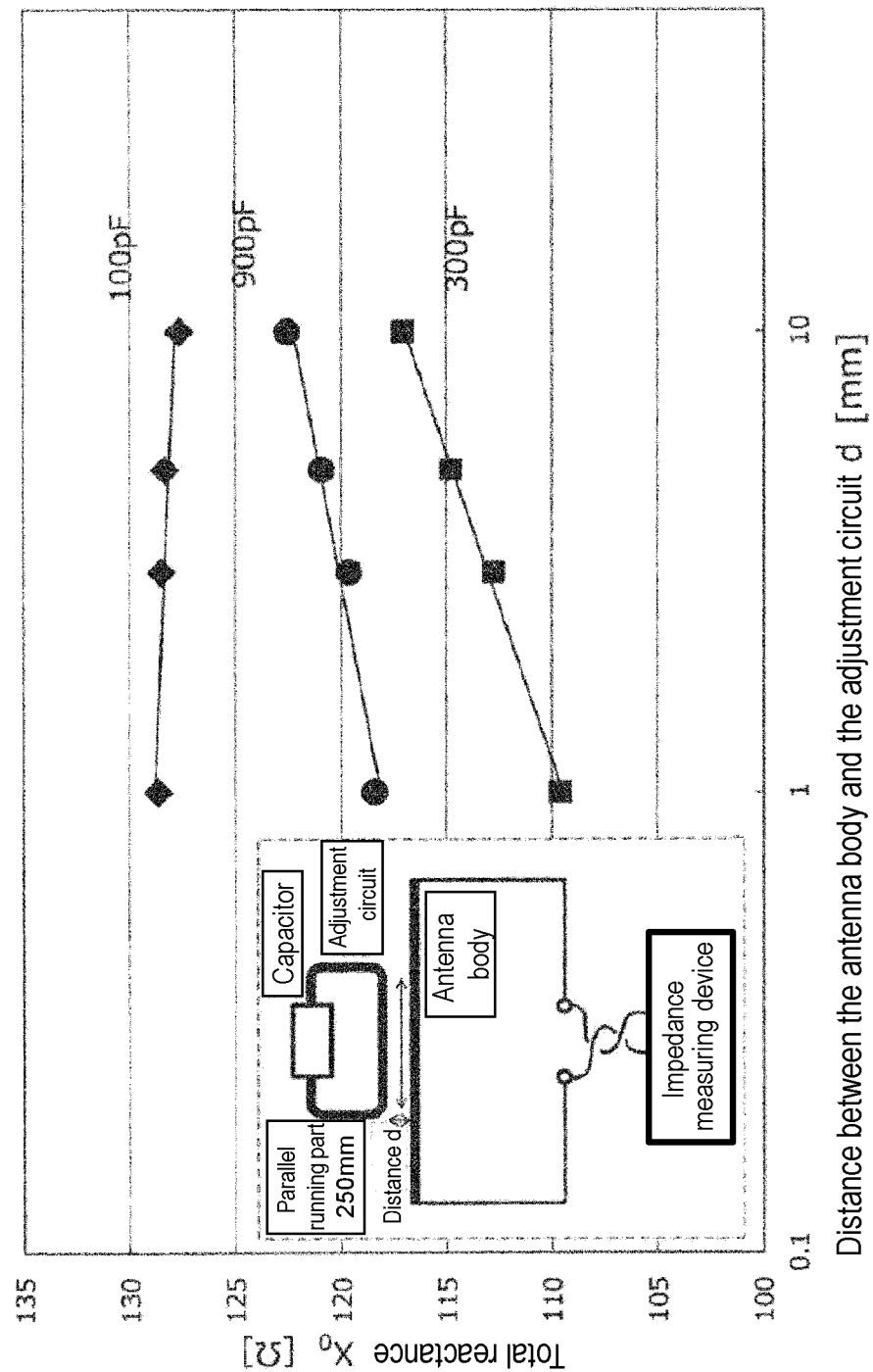
FIG. 4 is an experimental result showing the relationship between the distance d of the adjustment circuit and the antenna body and the impedance (total reactance $X_0$) of the antenna body.

Next, FIG. 4 shows the experimental result of the change in the total reactance $X_0$ when the distance d between the antenna body 31 and the adjustment circuit 32 was changed between 1 mm and 10 mm. Here, cases of using capacitors 322 having an electrostatic capacitance of 100 pF, 300 pF, and 900 pF, respectively, are shown. As clearly shown in FIG. 4, the total reactance $X_0$ of the antenna body 31 can be adjusted by changing the distance d between the antenna body 31 and the adjustment circuit 32.

<Effect of the Present Embodiment>

According to the plasma processing device 100 configured in this way, since the adjustment circuit 32 including the metal conductor 321 and the capacitor 322 is adjacent to the antenna body 31 through which a high-frequency current flows, the impedance of the antenna body 31 can be adjusted by a simple configuration without providing a capacitor in the antenna body 31. That is, by applying a high-frequency current to the antenna body 31, a secondary current flows through the metal conductor 321 to cause mutual induction (mutual inductance) between the metal conductor 321 and the antenna body 31. As a result, an electrostatic capacitance (capacitance) is effectively developed in the antenna body 31, which is the same as that a capacitive element (capacitor) is electrically connected in series in the middle of the antenna body 31. As a result, the synthetic reactance of the antenna body 31 can be made into a form obtained by subtracting the capacitive reactance from the inductive reactance, and the impedance of the antenna body 31 can be reduced. Accordingly, even if the length of the antenna body 31 is increased, the increase in impedance thereof is suppressed, a high-frequency current easily flows through the antenna body 31, and plasma can be efficiently generated with good uniformity.

Furthermore, the impedance of the antenna body 31 can be adjusted simply by adjusting the distance between the antenna body 31 and the adjustment circuit 32, and the impedance can be easily adjusted. Further, since the antenna body 31 is not provided with a capacitor, the antenna body 31 can be made of only a tube such as a metal pipe, and the antenna body 31 can be made thinner and smaller with no limitation on the outer diameter. Moreover, by making the antenna body 31 with only a tube such as a metal pipe, there is no connection portion in the middle of the antenna body 31, so there is no concern about leakage of cooling water when cooling water flows through the antenna body 31.

OTHER MODIFIED EMBODIMENTS

The present invention is not limited to the above embodiment.

For example, as shown in (1) and (2) of FIG. 5, the antenna body 31 may be provided inside the vacuum container. (1) of FIG. 5 is an example in which only the antenna body 31 is provided inside the vacuum container 2 and the adjustment circuit 32 is provided outside the vacuum container 2 via the dielectric window. In the case of this example, since the adjustment circuit 32 is on the atmospheric side, it is easy to adjust the impedance of the antenna body 31. (2) of FIG. 5 is an example in which not only the antenna body 31 but also at least the parallel running part 321a of the adjustment circuit 32 is provided in the vacuum container 2. In addition, not only the antenna body 31 but also the entire adjustment circuit 32 may be provided in the vacuum container 2. When the antenna body 31 is provided in the vacuum container 2, it is conceivable to cover the periphery of the antenna body 31 with, for example, an insulating cover 9 made of quartz to suppress the charged particles in the plasma P from being incident on the antenna body 31.

In the above embodiment, the impedance of the antenna body 31 is adjusted by adjusting the distance between the antenna body 31 and the parallel running part 321a, but in addition thereto, the impedance of the antenna body 31 may be adjusted by adjusting the length of the parallel running part 321a, or the impedance of the antenna body 31 may be adjusted by adjusting the electrostatic capacitance of the capacitive element 322 of the adjustment circuit 32.

Further, if there is a possibility that a standing wave may occur in the antenna body 31 due to the frequency of the high-frequency power supply supplied to the antenna body 31 and the length of the antenna body 31, the antenna body 31 may be divided and a fixed capacitor may be provided therebetween.

Further, in the above embodiment, the antenna body 31 has a linear shape, but the antenna body 31 may have a curved or bent shape. In this case, it is conceivable to also set the shape of the metal conductor of the adjustment circuit to correspond to the shape of the antenna body 31.

Furthermore, in the above embodiment, the parallel running part 321a of the metal conductor 321 of the adjustment circuit 32 is configured to be parallel with the antenna body 31, but the parallel running part 321a may not be parallel.

In addition, the present invention is not limited to the above-described embodiment, and needless to say, various modifications can be made without departing from the spirit of the present invention.

INDUSTRIAL APPLICABILITY

According to the present invention, the impedance of the antenna through which a high-frequency current flows to generate plasma can be adjusted by a simple configuration.

What is claimed is:

1. An antenna mechanism for generating plasma, comprising:
   an antenna body through which a high-frequency current flows; and
   a plurality of adjustment circuits through which a secondary current generated as an induced current caused by the high-frequency current flowing through the antenna body,
   wherein each of the plurality of adjustment circuits has a metal conductor and a capacitive element constituting a closed circuit.

2. The antenna mechanism according to claim 1, wherein the antenna body and the plurality of adjustment circuits are provided outside a vacuum container that is evacuated.

3. The antenna mechanism according to claim 1, wherein the metal conductor has an internal flow path through which cooling water flows inside.

4. The antenna mechanism according to claim 1, wherein the plurality of adjustment circuits are provided at equal intervals with each other in a length direction of the antenna body.

5. The antenna mechanism according to claim 1, wherein the plurality of adjustment circuits have the same configuration as one another.

6. The antenna mechanism according to claim 1, wherein the metal conductor has a parallel running part that faces the antenna body and extends in parallel with the antenna body, and
   the parallel running parts of the plurality of adjustment circuits have the same length as one another.

7. A plasma processing device, comprising:
   a vacuum container which is evacuated and into which a gas is introduced;
   the antenna mechanism according to claim 1; and
   a high-frequency power supply which applies a high-frequency current to the antenna body,
   wherein the plasma processing device is configured to process an object to be processed using plasma generated by the antenna mechanism.

8. The plasma processing device according to claim 7, wherein the antenna mechanism is provided outside the vacuum container, and
   the vacuum container is provided with a dielectric window at a position facing the antenna body.

9. An antenna mechanism for generating plasma, comprising:
   an antenna body through which a high-frequency current flows; and
   an adjustment circuit through which a secondary current generated as an induced current caused by the high-frequency current flowing through the antenna body,
   wherein the adjustment circuit has a metal conductor and a capacitive element constituting a closed circuit.

10. The antenna mechanism according to claim 9, wherein the antenna body and the adjustment circuit are provided outside a vacuum container that is evacuated.

11. The antenna mechanism according to claim 9, wherein the metal conductor has an internal flow path through which cooling water flows inside.

12. A plasma processing device, comprising:
    a vacuum container which is evacuated and into which a gas is introduced;
    the antenna mechanism according to claim 9; and
    a high-frequency power supply which applies a high-frequency current to the antenna body,
    wherein the plasma processing device is configured to process an object to be processed using plasma generated by the antenna mechanism.

13. The plasma processing device according to claim 12, wherein the antenna mechanism is provided outside the vacuum container, and
    the vacuum container is provided with a dielectric window at a position facing the antenna body.

* * * * *